United States Patent [19]

Hatsuda

[11] Patent Number: 5,764,094
[45] Date of Patent: Jun. 9, 1998

[54] LEVEL SHIFT CIRCUIT FOR ANALOG SIGNAL AND SIGNAL WAVEFORM GENERATOR INCLUDING THE SAME

[75] Inventor: Tsuguyasu Hatsuda, Osaka, Japan

[73] Assignee: Matsushita Electric Industrial Co., Ltd., Osaka, Japan

[21] Appl. No.: 657,735

[22] Filed: May 31, 1996

[30] Foreign Application Priority Data

Jun. 2, 1995 [JP] Japan .................... 7-136388

[51] Int. Cl.$^6$ ............................. H03L 5/00; H03D 13/00
[52] U.S. Cl. .............................. 327/333; 327/3
[58] Field of Search ....................... 327/333, 100, 327/106, 3, 5, 8, 12, 63, 67, 69, 73, 90; 326/62, 63, 68, 80; 341/144, 147

[56] References Cited

U.S. PATENT DOCUMENTS

| | | | |
|---|---|---|---|
| 4,280,219 | 7/1981 | Lowenschuss et al. | 375/4 |
| 5,369,318 | 11/1994 | Kuroda et al. | 327/333 |
| 5,426,616 | 6/1995 | Kajigaya et al. | 365/226 |
| 5,430,799 | 7/1995 | Katznelson | 380/15 |
| 5,457,421 | 10/1995 | Tanabe | 327/333 |
| 5,459,427 | 10/1995 | Chambers et al. | 327/333 |
| 5,467,043 | 11/1995 | Ohi | 327/333 |
| 5,506,541 | 4/1996 | Herndon | 327/541 |
| 5,617,045 | 4/1997 | Asahina | 327/333 |

FOREIGN PATENT DOCUMENTS 7-254916  10/1995  Japan .

OTHER PUBLICATIONS

Proceedings of the IEEE 1994 Custom Integrated Circuits Conference, May 1–4, 1994.

Primary Examiner—Timothy P. Callahan
Assistant Examiner—My-Trang Nu Ton
Attorney, Agent, or Firm—McDermott, Will & Emery

[57] ABSTRACT

The level shift circuit of this invention includes two reference voltage level generation devices, and a difference between two reference voltage levels generated by these reference voltage level generation devices is used as a level shift voltage to be analog-added to an input analog signal. At least one of the two reference voltage level generation devices has a function to change the reference voltage level thereof in accordance with a supplied offset voltage adjusting signal, thereby changing the level shift voltage to be analog-added to the analog signal in accordance with the offset voltage adjusting signal. Thus, the level shift circuit achieves a function to adjust an offset voltage. When this level shift circuit is applied to a signal waveform generator, there is no need to provide the offset voltage adjusting function to a D/A converter. As a result, the power consumption as well as the circuit area of the signal waveform generator can be decreased.

11 Claims, 10 Drawing Sheets

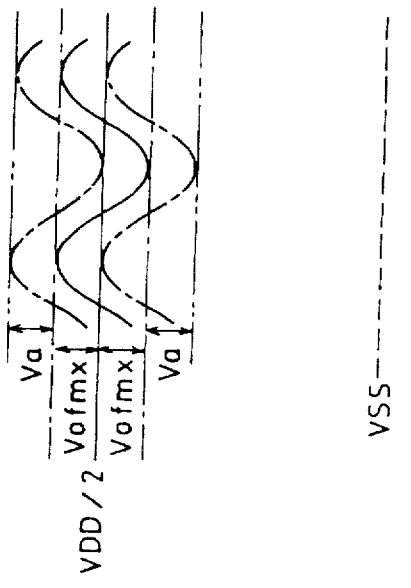
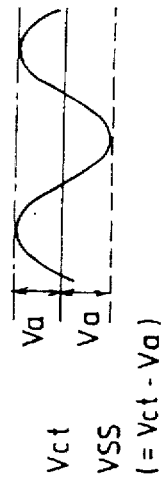
Fig. 9(a) Vdac
Fig. 9(b) Vsg, Vm
Fig. 9(c) Vls

5,764,094

LEVEL SHIFT CIRCUIT FOR ANALOG SIGNAL AND SIGNAL WAVEFORM GENERATOR INCLUDING THE SAME

BACKGROUND OF THE INVENTION

The present invention relates to a level shift circuit for an analog signal having an offset voltage adjusting function, and to a signal waveform generator including the level shift circuit applicable to digital communication using modulation techniques such as BPSK, QPSK and QAM.

A transmitter used for digital communication generally comprises a modulator unit for generating a base band signal and an orthogonal modulator for outputting an orthogonally modulated signal by performing analog orthogonal modulation on the generated base band signal.

The modulator unit includes a signal waveform generator for generating a waveform of a base band signal. The signal waveform generator includes a ROM for storing waveform data of roll-off shaped sine or cosine waves and outputting a waveform datum in a desired address, a D/A converter unit for converting the waveform datum output by the ROM into an analog signal, and a low-pass filter for decreasing a quantum noise of the analog signal output by the D/A converter unit so as to output the base band signal.

Since the modulator unit and the orthogonal modulator are formed out of semiconductor integrated circuits manufactured by using different processes, a signal voltage level for achieving the best performance such as a signal/noise ratio and modulation accuracy can be different in the modulator unit and the orthogonal modulator. In particular, since a portion between the D/A converter unit of the signal waveform generator and the orthogonal modulator includes an analog circuit, the voltage level at a DC level of a signal, that is, a signal ground voltage level, works as one of the factors for determining the performance of the transmitter.

Accordingly, the signal waveform generator generally has a function to shift the level (i.e., change the voltage level) of a base band signal, and also has a function to adjust an offset voltage to be applied to the base band signal in order to make the signal ground voltage level of the base band signal accord with a signal ground voltage level optimal for the performance of the orthogonal modulator.

FIG. 10 is a circuit diagram for showing the configuration of a current cell matrix type ten-bit D/A converter as an example of a D/A converter used in the D/A converter unit of the conventional signal waveform generator.

The current cell matrix type D/A converter shown in FIG. 10 comprises a plurality of unit current cells, a row decoder, a column decoder and a load resistance Rdac. One or more of the unit current cells are selected in accordance with an input code and a current flowing from the selected unit current cell is supplied to the load resistance Rdac, so as to determine the voltage level of an analog signal Vdac. Each unit current cell outputs a given current when both row decode signal and column decode signal are at a high level. The input code is a digital signal of ten bits, and not only generates the waveform of the base band signal but also instructs the adjustment of the offset voltage.

In the current cell matrix type D/A converter, the unit current cells in the number of ($2^7-1$), each having a current value of $IO/2^7$, are arranged in the form of an array, and three unit current cells respectively having current values of $IO/2^8$, $IO/2^9$ and $IO/2^{10}$ are also aligned. "IO" herein indicates a current value of a full scale current obtained when the output currents of all the unit current cells flow into the load resistance Rdac. The higher seven bits of the input code are D/A converted depending upon the number of the selected unit current cells each having the current value of $IO/2^7$, and the lower three bits are D/A converted depending upon whether or not the unit current cells respectively having the different current values are selected. Thus, the ten bits in total are D/A converted.

As an example of the D/A converter, the current cell matrix type D/A converter is shown in FIG. 10, but it is possible to use, for achieving higher conversion speed and accuracy, another type of D/A converter such as a current source type D/A converter whose output voltage is determined by supplying an output current of a constant current source to a load resistance (Proceedings of the IEEE 1994, Custom Integrated Circuits Conference, p. 16.6.1–16.6.4).

The conventional signal waveform generator, however, has the following problems:

In the conventional signal waveform generator, it is the D/A converter that has the function to adjust the offset voltage to be applied to the base band signal. When the current cell matrix type D/A converter of FIG. 10 is used in the signal waveform generator, some of the unit current cells included in the current cell matrix type D/A converter are used for generating the offset voltage.

FIG. 11 shows an analog signal Vdac generated by the current cell matrix type D/A converter of FIG. 10, wherein the analog signal Vdac has a signal waveform with an amplitude of Va. In FIG. 11, SA indicates a signal having a medium voltage level of Vct, SB indicates a signal obtained by applying an offset voltage with a maximum value of Vofmx to the signal SA, and SC indicates a signal obtained by applying an offset voltage with a minimum value of −Vofmx to the signal SA. In this case, it is assumed that the amplitude Va of the signal is equal to the maximum value Vofmx of the offset voltage.

When the analog signal as is shown in FIG. 11 is used, a half of the unit current cells included in the current cell matrix type D/A converter are used for generating the offset voltage.

However, the unit current cells for generating the offset voltage make no contribution to the generation of the waveform of the base band signal, that is, the original function of the current cell matrix type D/A converter. Therefore, the power consumed by the current cell matrix type D/A converter is largely increased as compared with the case where it merely generates the waveform of the base band signal. In addition, since the necessary number of the unit current cells is increased, the area occupied by the current cell matrix type D/A converter is also increased, resulting in disadvantageously increasing the circuit area of the signal waveform generator.

In particular, when a signal waveform generator is used for portable equipment such as a portable telephone and a portable remote terminal, the signal waveform generator is required to have small power consumption because the portable equipment is occasionally continuously used for a long period of time, and is also required to have a small circuit area for decreasing the cost of the portable equipment.

SUMMARY OF THE INVENTION

The present invention provides a level shift circuit for an analog signal having an offset voltage adjusting function, and realizes a signal waveform generator having small power consumption and a small circuit area by making use of the level shift circuit.

Specifically, the level shift circuit for level-shifting an input analog signal of this invention comprises first reference voltage level generation means for generating a reference voltage level; and second reference voltage level generation means for generating another reference voltage level. In this level shift circuit, at least one of the first and second reference voltage level generation means has a function to change the reference voltage level thereof in accordance with a supplied offset voltage adjusting signal, and a level shift voltage, which is obtained as a difference between the reference voltage level generated by the first reference voltage level generation means and the other reference voltage level generated by the second reference voltage level generation means, is analog-added to the input analog signal.

Owing to this configuration, the level shift voltage to be analog-added to the input analog signal is varied in accordance with the offset voltage adjusting signal. Thus, the level shift circuit achieves the function to adjust the offset voltage. When this level shift circuit is applied to a signal waveform generator, there is no need to provide a D/A converter therein with the offset voltage adjusting function. As a result, not only the power consumption but also the circuit area of the signal waveform generator can be decreased.

Alternatively, the level shift circuit of this invention comprises a first signal level shifter for analog-adding a level shift voltage determined in accordance with a supplied bias voltage level signal to a voltage level of an analog signal inputted to the level shift circuit and outputting a voltage level obtained through analog addition as an output signal of the level shift circuit; first reference voltage level generation means for generating and outputting a first reference voltage level; second reference voltage level generation means for generating and outputting a second reference voltage level; a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters. In this level shift circuit, it is preferred that the first reference voltage level generation means receives an offset voltage adjusting signal and has a function to change the first reference voltage level in accordance with the offset voltage adjusting signal.

Owing to this configuration, the level shift voltage to be analog-added to the voltage level of the analog signal input to the level shift circuit is obtained as a voltage level difference between the first reference voltage level changed in accordance with the offset voltage adjusting signal and the second reference voltage level. Accordingly, this level shift circuit has a function to adjust the offset voltage.

Alternatively, the level shift circuit of this invention comprises a first signal level shifter for analog-adding a level shift voltage determined in accordance with a supplied bias voltage level signal to a voltage level of an analog signal input to the level shift circuit and outputting a voltage level obtained through analog addition as an output signal of the level shift circuit; first reference voltage level generation means for generating and outputting a first reference voltage level; second reference voltage level generation means for generating and outputting a second reference voltage level; a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters. In this level shift circuit, it is preferred that the second reference voltage level generation means receives an offset voltage adjusting signal and has a function to change the second reference voltage level in accordance with the offset voltage adjusting signal.

Owing to this configuration, the level shift voltage to be analog-added to the voltage level of the analog signal input to the level shift circuit is obtained as a voltage level difference between the first reference voltage level and the second reference voltage level changed in accordance with the offset voltage adjusting signal. Accordingly, this level shift circuit has a function to adjust the offset voltage.

Furthermore, the signal waveform generator of this invention comprises memory means for storing codes corresponding to amplitude values of a signal and outputting a code in a specified address; a D/A converter unit for receiving the code output by the memory means, converting the code into an analog signal and outputting the analog signal; and a low-pass filter for receiving the analog signal output by the D/A converter unit, removing a high frequency component from the analog signal and outputting a resultant signal. In this signal waveform generator, the D/A converter unit includes a D/A converter for generating an analog signal by D/A converting the code output by the memory means and outputting the analog signal; and a level shift circuit for not only level-shifting the analog signal output by the D/A converter and but also adjusting an offset voltage. The signal output by the low-pass filter is an output signal of the signal waveform generator.

Owing to this configuration, even though the D/A converter does not have a function to adjust the offset voltage, the offset voltage can be adjusted by the level shift circuit. Accordingly, the range of the output voltage level of the D/A converter can be only the range of the voltage level of the generated signal waveform. As a result, the power consumption as well as the circuit area of the signal waveform generator can be decreased as compared with those of the conventional one.

BRIEF DESCRIPTION OF THE DRAWINGS

FIGS. 5(a) through 5(c) are explanatory diagrams for the operation of the D/A converter unit of the signal waveform generator of the first embodiment, wherein FIG. 5(a) shows an analog signal Vdac, FIG. 5(b) shows a signal ground voltage level Vsg and a signal medium voltage level Vm and FIG. 5(c) shows a base band signal Vls to which an offset voltage has been applied;

FIGS. 7(a) through 7(c) are explanatory diagrams for the operation of the D/A converter unit of the signal waveform generator of the comparative embodiment, wherein FIG. 7(a) shows an analog signal Vdac, FIG. 7(b) shows a signal ground voltage level Vsg and a signal medium voltage level Vm and FIG. 7(c) shows a base band signal Vls to which an offset voltage has been applied;

FIGS. 9(a) through 9(c) are explanatory diagrams for the operation of the D/A converter unit of the signal waveform generator of the second embodiment, wherein FIG. 9(a) shows an analog signal Vdac, FIG. 9(b) shows a signal ground voltage level Vsg and a signal medium voltage level Vm and FIG. 9(c) shows a base band signal Vls to which an offset voltage has been applied;

DETAILED DESCRIPTION OF THE INVENTION

Figure 1:
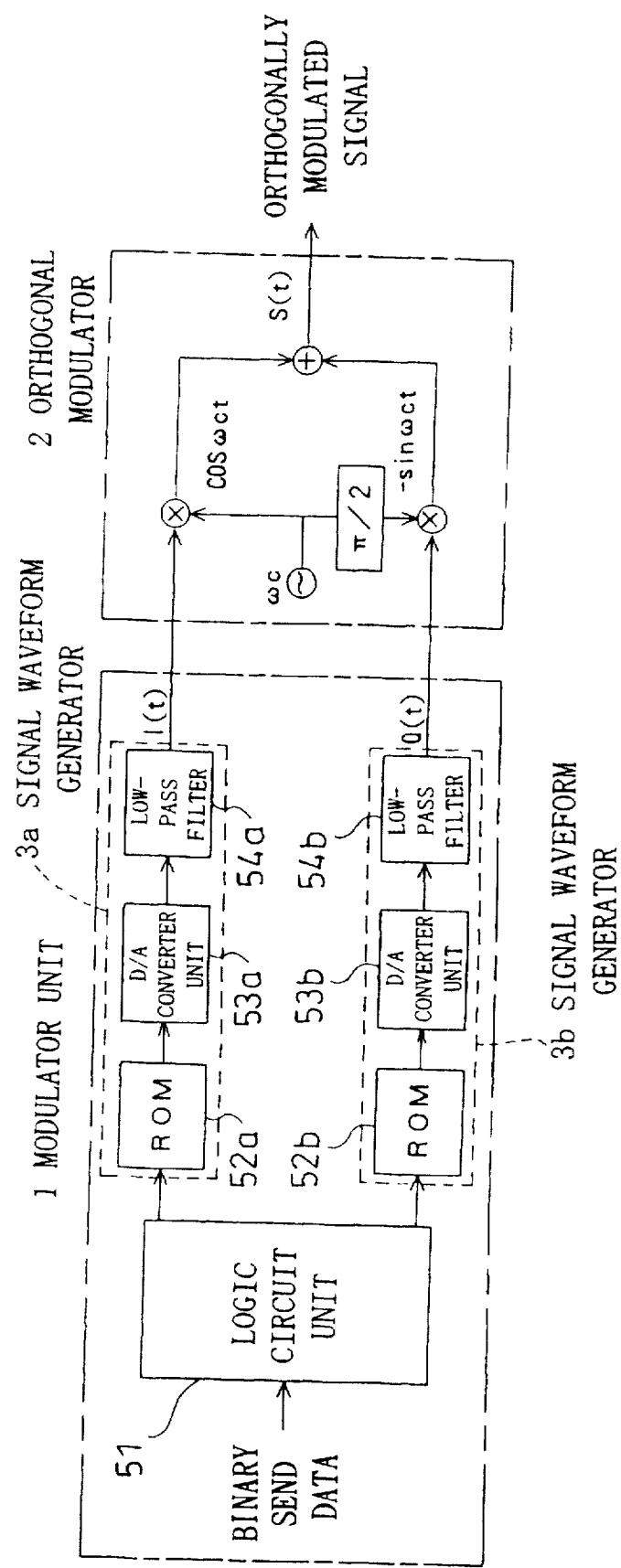
FIG. 1 is a block diagram for showing the configuration of a main part of a transmitter for digital communication.

FIG. 1 shows the configuration of a part of a transmitter for digital communication. In FIG. 1, a reference numeral 1 denotes a modulator unit for generating a base band signal and a reference numeral 2 denotes an orthogonal modulator for outputting an orthogonally modulated signal by conducting analog orthogonal modulation on the base band signal. FIG. 1 exemplifies the case where the modulator unit 1 includes two signal waveform generators 3a and 3b for generating base band signals I(t) and Q(t). The signal waveform generator 3a includes a ROM 52a serving as memory means, a D/A converter unit 53a and a low-pass filter 54a, and the signal waveform generator 3b includes a ROM 52b serving as memory means, a D/A converter unit 53b and a low-pass filter 54b.

Binary send data supplied to the modulator unit 1 are serial/parallel converted and differentially coded by a logic circuit unit 51. The ROM 52a stores waveform data of roll-off shaped sine waves, and outputs a waveform datum in an address corresponding to the datum received from the logic circuit unit 51. The D/A converter unit 53a converts the waveform datum supplied from the ROM 52a into an analog signal. The ROM 52a and the D/A converter unit 53a together has a function as a roll-off filter having a raised cosine characteristic and the like.

Also, the ROM 52b stores waveform data of roll-off shaped cosine waves, and outputs a waveform datum in an address corresponding to the datum received from the logic circuit unit 51. The D/A converter unit 53b converts the waveform datum supplied from the ROM 52b into an analog signal. The ROM 52b and the D/A converter unit 53b together has a function as a roll-off filter having a raised cosine characteristic and the like.

The low-pass filter 54a decreases a quantum noise in the analog signal output by the D/A converter unit 53a, so as to output the base band signal I(t) having an amplitude of Va and a frequency of ωb. Similarly, the low-pass filter 54b decreases a quantum noise in the analog signal output by the D/A converter unit 53b, so as to output the base band signal Q(t) having an amplitude of Va and a frequency of ωb.

In the orthogonal modulator 2, the base band signals I(t) and Q(t) are analog-multiplied by a carrier having a carrier frequency of ωc (cos ωc t and −sin ωc t), and the resultant signals are further analog-added to each other. As a result, an orthogonally modulated signal S(t) is output.

In the transmitter for digital communication shown in FIG. 1, the modulator unit 1 is formed out of semiconductor integrated circuits manufactured by using the CMOS process so that the production cost is decreased by increasing the degree of integration. The orthogonal modulator 2 is formed out of semiconductor integrated circuits manufactured by using the bipolar process or GaAs because the carrier frequency ωc is as high as several hundred MHz to several GHz. Since the modulator unit 1 and the orthogonal modulator 2 are thus formed out of the semiconductor integrated circuits using the different processes, a signal voltage level for achieving the best performance such as a signal/noise ratio and modulation accuracy can be different in the modulator unit 1 and the orthogonal modulator 2. In particular, since portions between the D/A converter units 53a and 53b of the modulator unit 1 and the orthogonal modulator 2 include analog circuits, a voltage level at a DC level of a signal, that is, a signal ground voltage level, works as one of the factors for determining the performance of the transmitter.

Accordingly, the modulator unit 1 generally has a function to adjust an offset voltage to be applied to the base band signal in order to make the signal ground voltage level of the base band signal accord with a signal ground voltage level optimal to the performance of the orthogonal modulator 2. The modulator unit 1 has the function to adjust the offset voltage for the following reason: The modulator unit 1 has a high degree of integration since it is formed out of the semiconductor integrated circuits using the CMOS process. Therefore, the production cost can be lower than in the case where the orthogonal modulator 2 has the function to adjust the offset voltage.

In the following embodiments, the D/A converter unit is provided with a level shift circuit for an analog signal having the function to adjust the offset voltage, so that the power consumption as well as the circuit area of the signal waveform generator can be decreased.

Embodiment 1

Figure 2:
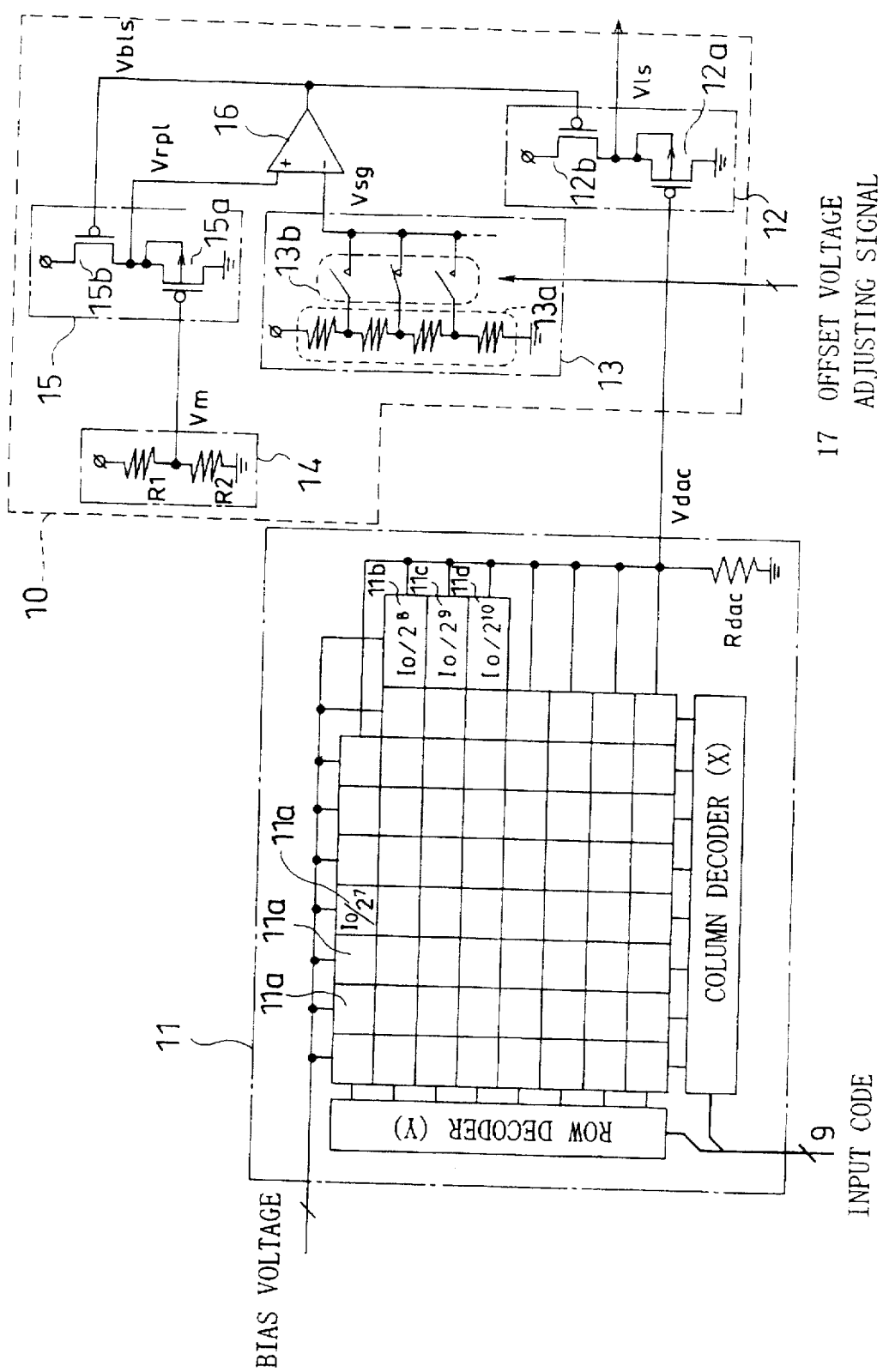
FIG. 2 is a circuit diagram for showing the configuration of a D/A converter unit of a signal waveform generator according to a first embodiment of the invention.

FIG. 2 is a diagram for showing the configuration of a D/A converter unit of a signal waveform generator of the first embodiment of the invention. In FIG. 2, a reference numeral 10 denotes a level shift circuit and a reference numeral 11 denotes a current cell matrix type nine-bit D/A converter. The level shift circuit 10 comprises a first signal level shifter 12, a signal ground voltage level decision circuit 13 serving as first reference voltage level generation means, a signal medium voltage level reference circuit 14 serving as second reference voltage level generation means, a second signal level shifter 15 and an operational amplifier 16.

An input code supplied to the current cell matrix type D/A converter 11 is a digital signal of nine bits output by the corresponding ROM, and generates the waveform of a base band signal. Also, a signal Vls is supplied to the corresponding low-pass filter.

The current cell matrix type D/A converter 11 comprises a plurality of unit current cells, a row decoder, a column decoder and a load resistance Rdac. One or more of the unit current cells are selected in accordance with the input code of nine bits corresponding to the signal waveform, and a current flowing from the selected unit current cell is supplied to the load resistance Rdac, so that the voltage level of an analog signal Vdac is determined.

Figure 3:
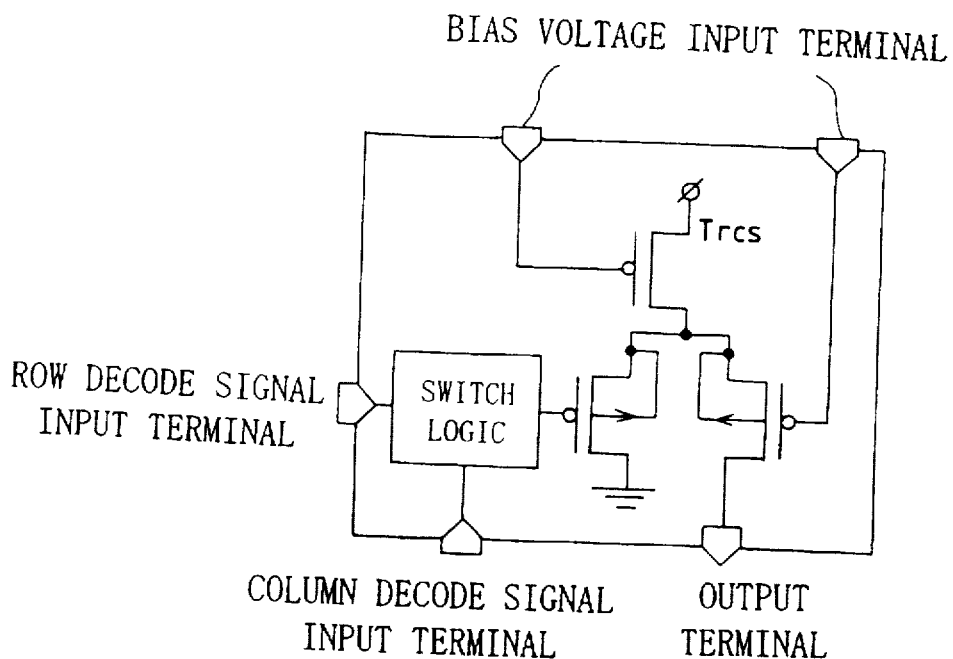
FIG. 3 is a circuit diagram for showing the configuration of a unit current cell.

Each unit current cell has a configuration as is shown in FIG. 3, and outputs a given current when both row decode signal and column decode signal are at a high level. The output current value of the unit current cell can be set by adjusting the gate width of a constant current transistor Trcs. Furthermore, a bias voltage externally supplied to the current cell matrix type D/A converter 11 is supplied to each unit current cell.

In the current cell matrix type D/A converter 11, unit current cells 11a in the number of $(2^6-1)$, each having a current value of $IO/2^7$, are arranged in the form of an array, and one unit current cell 11b having a current value of $IO/2^8$, one unit current cell 11c having a current value of $IO/2^9$ and one unit current cell 11d having a current value of $IO/2^{10}$ are also aligned. The current value IO in this embodiment is equal to the value of the full scale current in the current cell matrix type ten-bit D/A converter shown in FIG. 10. The higher six bits in the input code are D/A converted depending upon the number of the selected unit current cells 11a each having the current value of $IO/2^7$, and the lower three bits are D/A converted depending upon whether or not the unit current cells 11b, 11c and 11d respectively having the different current values are selected. Thus, the nine bits in total are D/A converted.

Figure 10:
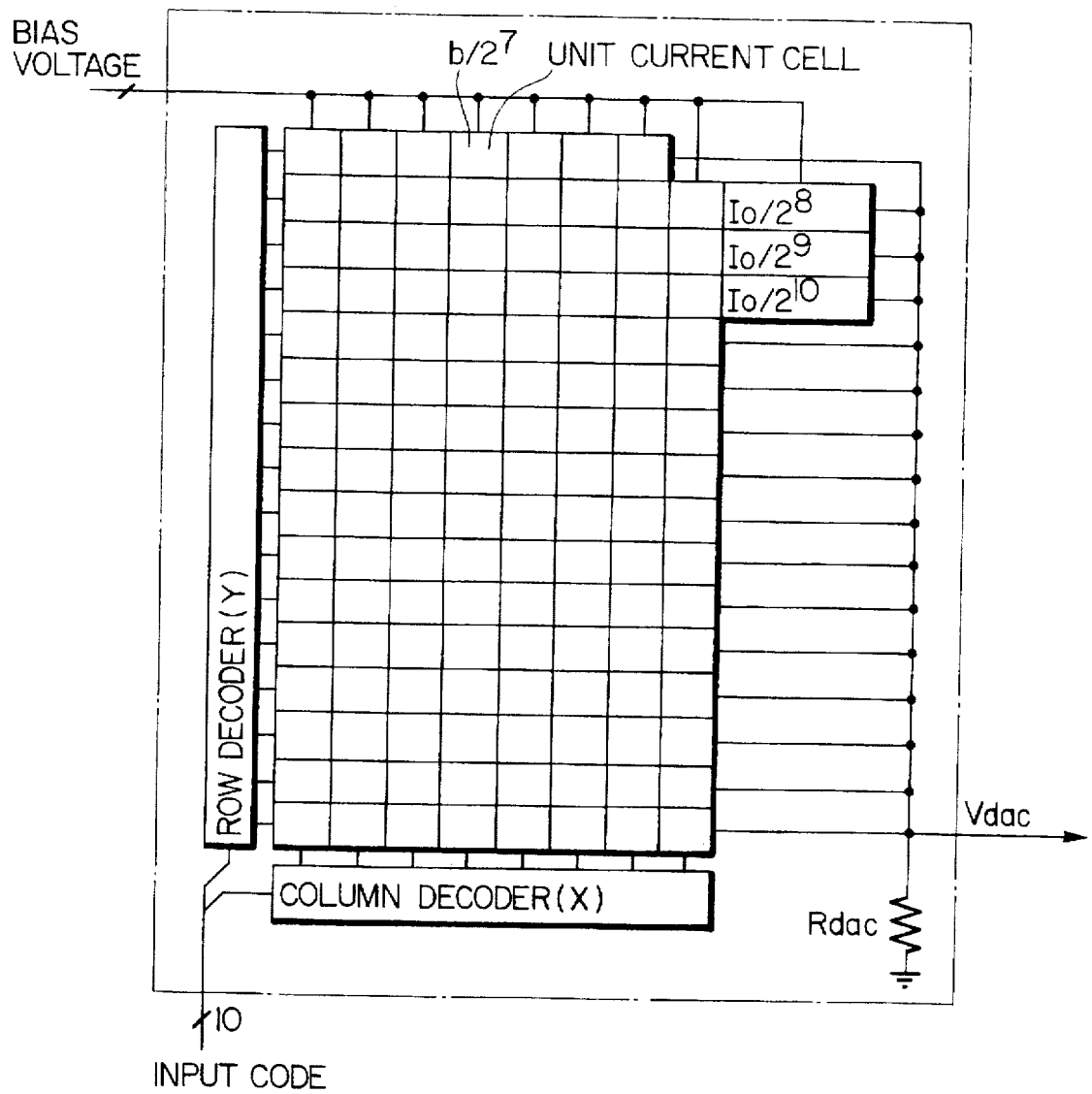
FIG. 10 is a diagram for showing the configuration of a current cell matrix type ten-bit D/A converter.
Figure 11:
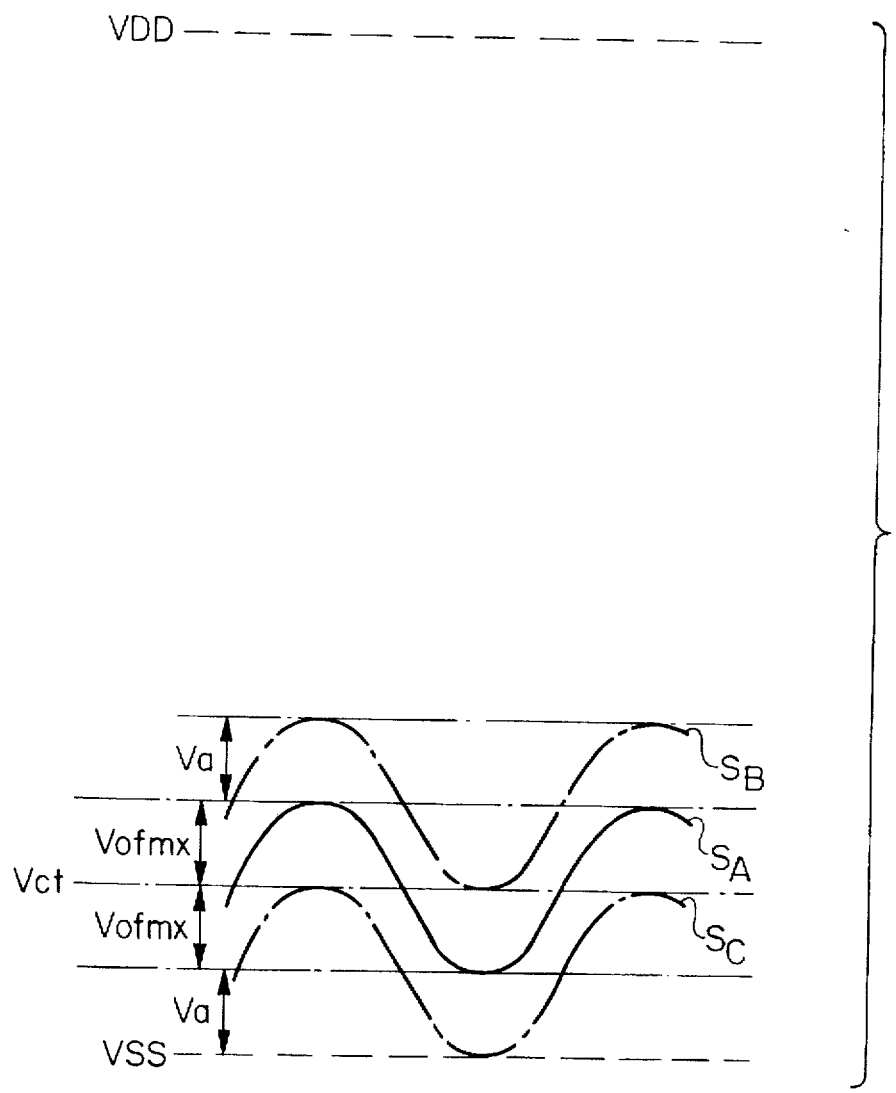
FIG. 11 shows the waveform of an output signal of the D/A converter of FIG. 10.

This D/A converter includes a smaller number of unit current cells than the current cell matrix type D/A converter of FIG. 10 because there is no need to provide this D/A converter with the function to adjust the offset voltage.

The first signal level shifter 12 is a source follower circuit including PMOSFETs 12a and 12b, and analog-adds a level shift voltage to the analog signal Vdac output by the current cell matrix type D/A converter 11, so as to output the signal Vls whose level has been shifted. The gate of the PMOSFET 12a is supplied with the analog signal Vdac, the gate of the PMOSFET 12b is supplied with an output voltage level Vbls of the operational amplifier 16, and the signal Vls is output from the source of the PMOSFET 12a (the drain of the PMOSFET 12b). The offset voltage is applied to the signal Vls, which will be described in detail below. Furthermore, the source of the PMOSFET 12a is connected with the substrate in order to prevent its threshold value from being varied due to the body bias effect.

Figure 4:
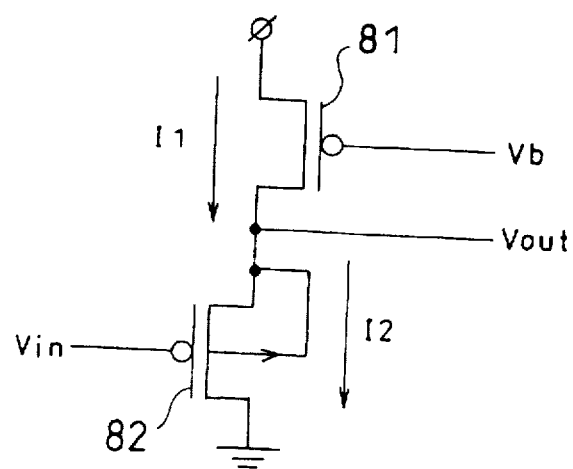
FIG. 4 is a circuit diagram for showing the configuration of a source follower circuit.

The source follower circuit will now be described. FIG. 4 is a circuit diagram for showing the operation of the source follower circuit. In FIG. 4, a reference numeral 81 denotes a PMOSFET whose source is connected with a power supply and whose gate is supplied with a bias voltage level Vb, and a reference numeral 82 denotes a PMOSFET whose source is connected with the drain of the PMOSFET 81, whose drain is grounded and whose gate is supplied with an input voltage level Vin. A voltage Vout is output from the drain of the PMOSFET 81 (the source of the PMOSFET 82). Furthermore, the source of the PMOSFET 82 is connected with the substrate at the same voltage level in order to prevent its threshold voltage from being varied due to the body bias effect.

Since a drain current I1 flowing through the PMOSFET 81 is equal to a drain current I2 flowing through the PMOSFET 82, the following relational expression holds:

$$I1=I2$$

$$\therefore \beta1\ (VDD-Vb-Vtp)^2 = \beta2\ (Vout-Vin-Vtp)^2$$

In this expression, $$\beta1=(\mu p \cdot Cox/2) \times (W1/L1)$$

$$\beta2=(\mu p \cdot Cox/2) \times (W2/L2),\ \text{and}$$

Vtp indicates a threshold voltage of the PMOSFET, μp indicates mobility of the PMOSFET, Cox indicates a gate capacity of the PMOSFET, W1/L1 indicates a ratio between the gate width and the gate length of the PMOSFET 81 and W2/L2 indicates a ratio between the gate width and the gate length of the PMOSFET 82. By solving this expression, the following relationship between the input voltage Vin and the output voltage Vout can be obtained:

$$Vout=Vin+(\beta1/\beta2)^{1/2} \cdot (VDD-Vb)+\{1-(\beta1/\beta2)^{1/2}\}Vtp$$

This expression reveals that the output voltage Vout of the source follower circuit of FIG. 4 is obtained by analog-adding a voltage determined in accordance with the bias voltage Vb to the input voltage Vin. Accordingly, the output voltage Vout is linearly varied against the input voltage Vin. At this point, for simplifying the following description, a function F, (Vin, Vb) is defined as follows:

$$Vout=F(Vin,\ Vb)$$

The signal ground voltage level decision circuit 13 includes a plurality of resistances 13a serially connected between a power supply and a ground and a selector circuit 13b. The selector circuit 13b selects a voltage level at one node among the plural resistances 13a in accordance with a supplied offset voltage adjusting signal 17, so as to decide a signal ground voltage level Vsg as a first reference voltage level. As the characteristic of this embodiment, the signal ground voltage level decision circuit 13 has the function to adjust the offset voltage applied to the signal Vls.

The signal medium voltage level reference circuit 14 includes resistances R1 and R2 serially connected between a power supply and a ground, and outputs a voltage level at the node between the two resistances as a signal medium voltage level Vm serving as a second reference voltage level. The resistance values of the resistances R1 and R2 are set so that the voltage level Vm is equal to a medium voltage level Vct of the analog signal Vdac output by the current cell matrix type D/A converter 11.

The second signal level shifter 15 has the same configuration as the first signal level shifter 12, or includes PMOSFETs 15a and 15b having an element size ratio equal to that of the PMOSFETs 12a and 12b included in the first signal level shifter 12. The gate of the PMOSFET 15a is supplied with the signal medium voltage level Vm output by the signal medium voltage level reference circuit 14, the gate of the PMOSFET 15b is supplied with the bias voltage level signal Vbls output by the operational amplifier 16, and a voltage level Vrpl is output from the source of the PMOSFET 15a (the drain of the PMOSFET 15b). Furthermore, the source of the PMOSFET 15a is connected with the substrate in order to prevent its threshold value from being varied due to the substrate bias effect.

The operational amplifier 16 receives the output voltage level Vrpl of the second signal level shifter 15 at its non-inverted input terminal and also receives the signal ground voltage level Vsg at its inverted input terminal, and outputs the bias voltage level signal Vbls. The operational amplifier 16 generally has a gain of 1000-fold or more.

Therefore, according to the virtual short principle, the operational amplifier 16 sets the bias voltage level signal Vbls so that the output voltage level Vrpl of the second signal level shifter 15 is equal to the signal ground voltage level Vsg. When the voltage level Vrpl is shifted from the signal ground voltage level Vsg, the bias voltage level signal Vbls is varied so that the voltage level Vrpl becomes equal to the signal ground voltage level Vsg through negative feedback.

The operation of the signal waveform generator of FIG. 2 will now be described in more detail referring to FIGS. 5(a) through 5(c).

Figure 5:
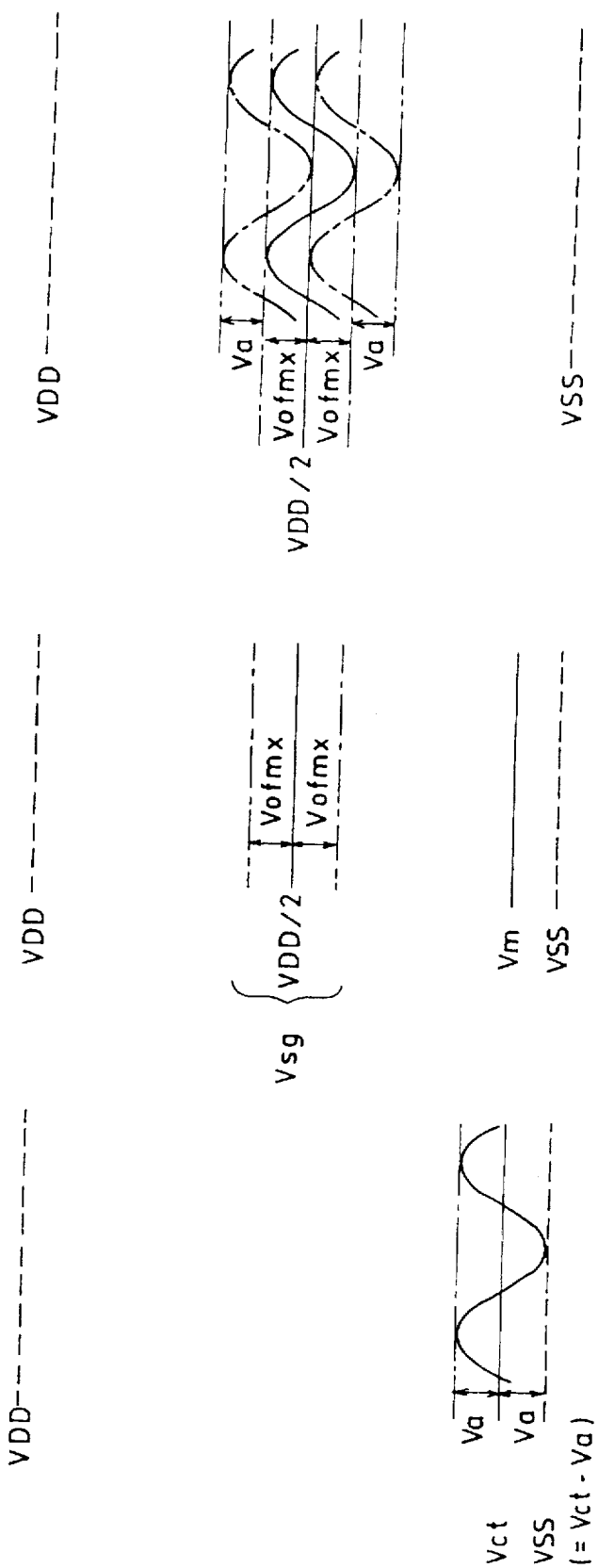

FIG. 5(a) shows the signal waveform of the analog signal Vdac output by the current cell matrix type D/A converter 11.

When the amplitude of the base band signal is indicated as Va and the medium voltage level thereof is indicated as Vct, the voltage level of the analog signal Vdac output by the current cell matrix type D/A converter 11 is a value in the following range:

$$Vct-Va \leq Vdac \leq Vct+Va \qquad \text{Expression (11)}$$

When Vct−Va=VSS=0, Vct=Va. Therefore, the following relationship holds:

$$VSS \leq Vdac \leq 2Va = IO/2 \times Rdac$$

Here, it is assumed that the maximum value of the analog signal Vdac of FIG. 10 is one third of the voltage level VDD. The value IO is equal to the full scale current of the current cell matrix type D/A converter of FIG. 10, and hence, the maximum voltage level of the analog signal Vdac is equal to a half of the maximum voltage level of the analog signal Vdac of FIG. 10, namely, one sixth of the supply voltage level VDD.

FIG. 5(b) shows the ranges of the signal ground voltage level Vsg and the signal medium voltage level Vm.

The signal ground voltage level Vsg is adjusted in accordance with the offset voltage adjusting signal 17 by using half a voltage level of the supply voltage VDD as a reference. When the offset voltage is indicated as Vof, $$Vsg = VDD/2 + Vof \qquad \text{Expression (12)}$$

When the maximum absolute value of the offset voltage Vof is indicated as Vofmx, the following relationship holds because |Vof| ≤ Vofmx:

$$VDD/2 - Vofmx \leq Vsg \leq VDD/2 + Vofmx$$

In FIG. 5(b), it is assumed that Vofmx=Va.

The signal medium voltage level Vm is equal to the medium voltage level Vct of the analog signal Vdac, and is represented as follows:

$$Vm = (VDD-VSS) \times R2/(R1+R2) = Vct \qquad \text{Expression (13)}$$

FIG. 5(c) shows the signal waveform and the range of the output signal Vls of the first signal level shifter 12. Since the first signal level shifter is a source follower circuit, the output voltage level Vls can be represented as follows:

$$Vls = F(Vdac, Vbls)$$

The second signal level shifter 15 is also a source follower circuit having the same characteristics as those of the first signal level shifter 12, and hence, its output voltage level Vrpl can be represented as follows:

$$Vrpl = F(Vm, Vbls)$$

The bias voltage level signal Vbls output by the operational amplifier 16 is determined so that the output voltage level Vrpl of the second signal level shifter 15 is equal to the signal ground voltage level Vsg, and hence, $$Vrpl = F(Vm, Vbls) = Vsg$$

Therefore, the output signal Vls of the first signal level shifter 12 can be represented as follows:

$$Vls = F(Vdac, Vbls) = F(Vdac+Vm-Vm, Vbls) = Vdac+Vsg-Vm \qquad \text{Expression (14)}$$

Specifically, in the first signal level shifter 12, a level shift voltage equal to a voltage level difference between the signal ground voltage level Vsg and the signal medium voltage level Vm is applied to the analog signal Vdac output by the current cell matrix type D/A converter 11, so as to output the signal Vls. On the basis of Expressions (11), (12), (13) and (14), the following relationship can be obtained:

$$Vls = Vdac + VDD/2 + Vof - Vm$$

$$VDD/2 + Vof - Va \leq Vls \leq VDD/2 + Vof + Va \qquad \text{Expression (15)}$$

The comparison between Expressions (11) and (15) reveals that the medium voltage level Vct of the analog signal Vdac is linearly level-shifted to a voltage level (VDD/2+Vof) in the signal Vls.

Accordingly, the minimum value {Vls}min and the maximum value {Vls}max of the signal Vls are obtained based on Expressions (11) and (15) as follows:

$$\text{Expression (16)}$$
$$\{Vls\}min = VDD/2 + \{Vof\}min - Va = VDD/2 - Vofmx - Va$$
$$\text{Expression (17)}$$
$$\{Vls\}max = VDD/2 + \{Vof\}max - Va = VDD/2 - Vofmx + Va$$

Among the signal waveforms shown in FIG. 5(c), the waveform shown with a solid line is a waveform of the signal Vls obtained by using a voltage level VDD/2 as a reference and the waveforms shown with dashed lines are waveforms of the signal Vls obtained when the offset voltages Vof with the maximum value Vofmx and the minimum value −Vofmx have been applied.

Figure 6:
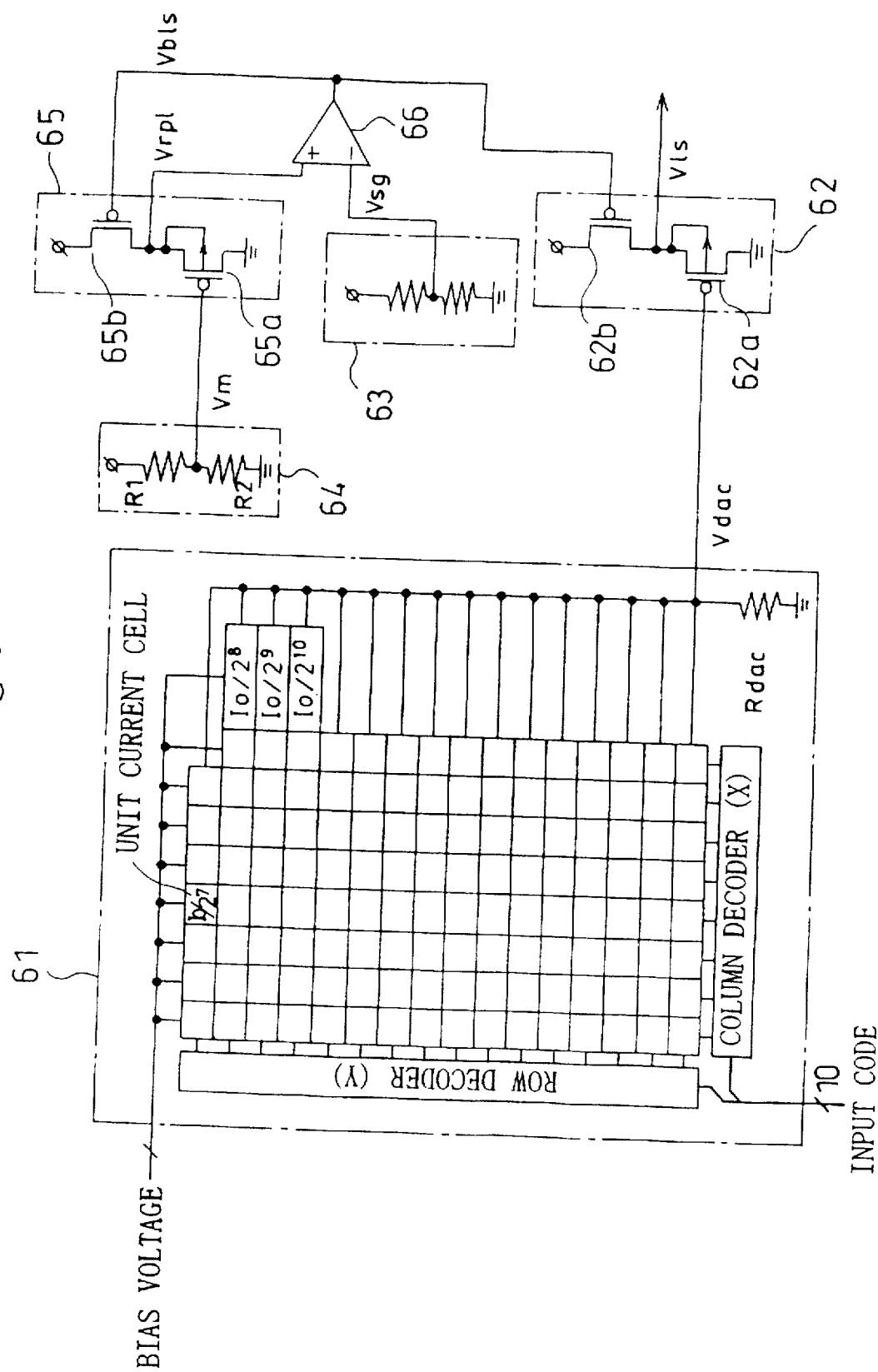
FIG. 6 is a circuit diagram for showing the configuration of a D/A converter unit of a signal waveform generator as a comparative embodiment.

FIG. 6 is a circuit diagram for showing the configuration of a D/A converter unit of a signal waveform generator as a comparative embodiment, in which the level shift circuit does not have the function to adjust the offset voltage.

In FIG. 6, a reference numeral 61 denotes a current cell matrix type ten-bit D/A converter identical to that shown in FIG. 10, a reference numeral 62 denotes a first signal level shifter including PMOSFETs 62a and 62b, a reference numeral 63 denotes a signal ground voltage level decision circuit including two resistances serially connected between a power supply and a ground, a reference numeral 64 denotes a signal medium voltage level reference circuit, a reference numeral 65 denotes a second signal level shifter including PMOSFETs 65a and 65b, and a reference numeral 66 denotes an operational amplifier. As compared with the D/A converter unit shown in FIG. 2, the first signal level shifter 62, the signal medium voltage level reference circuit 64, the second signal level shifter 65 and the operational amplifier 66 respectively have the same configurations as the first signal level shifter 12, the signal medium voltage level reference circuit 14, the second signal level shifter 15 and the operational amplifier 16.

Figure 7:
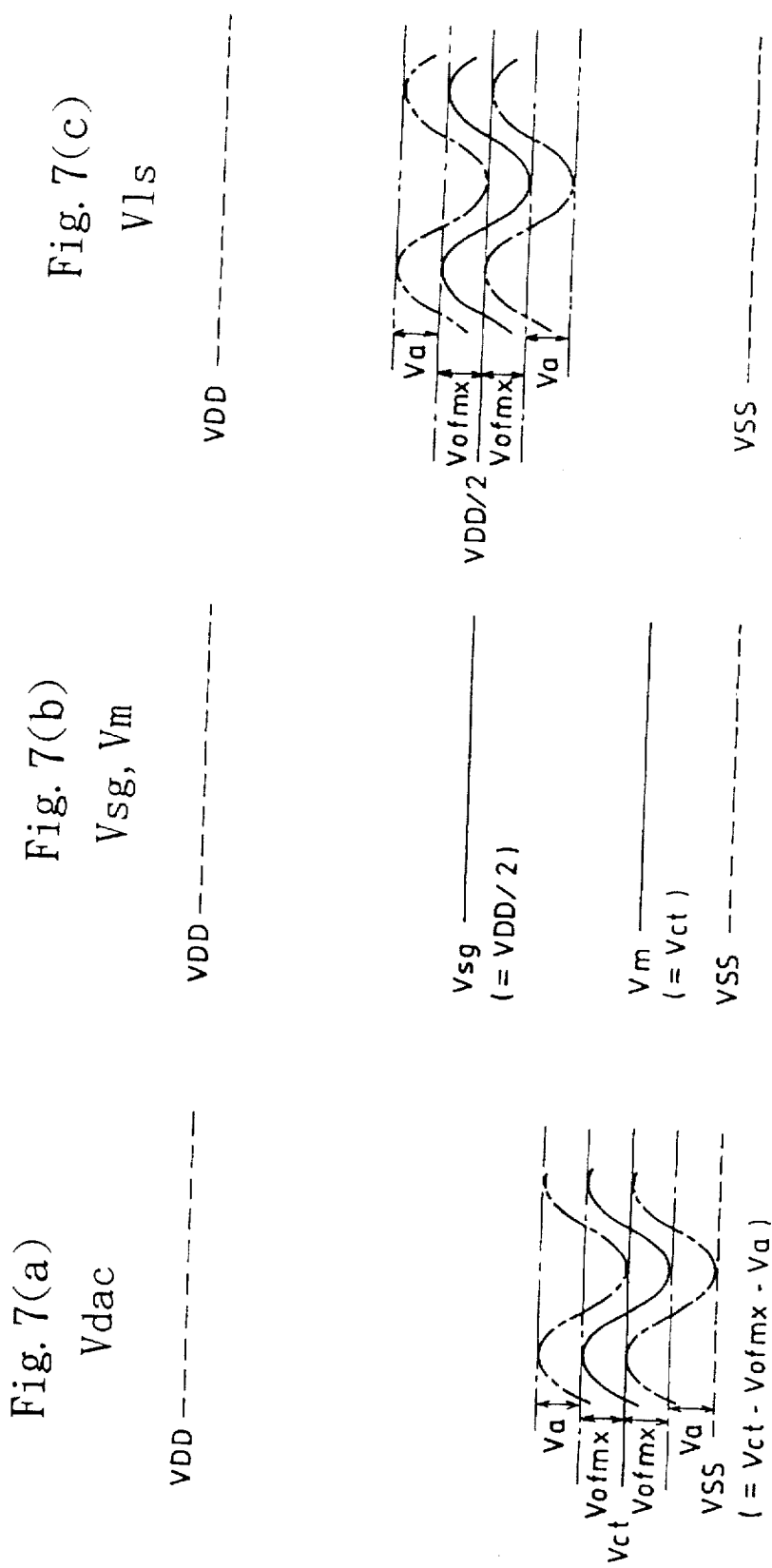

FIGS. 7(a) through 7(c) shows the level shift of an analog signal Vdac in the D/A converter unit of the comparative embodiment shown in FIG. 6, wherein FIG. 7(a) shows the waveform and the voltage level range of the analog signal Vdac, FIG. 7(b) shows the signal ground voltage level Vsg and the signal medium voltage level Vm, and FIG. 7(c) shows the signal waveform and the voltage level range of the level-shifted base band signal Vls.

An input code to be supplied to the current cell matrix type D/A converter 61 not only corresponds to the waveform of the base band signal but also has the function to adjust the offset voltage. Therefore, the analog signal Vdac is obtained by adding the offset voltage Vof to the base band signal. When the amplitude of the base band signal is indicated as Va, the maximum absolute value of the offset voltage Vof is indicated as Vofmx, and the medium voltage level of the output voltage level Vdac is indicated as Vct, the following relationship can be obtained:

$$Vct+Vof-Va \leq Vdac \leq Vct+Vof+Va \quad \text{Expression (51)}$$

Since $|Vof| \leq Vofmx$, $$Vct-Vofmx-Va \leq Vdac \leq Vct+Vofmx+Va \quad \text{Expression (52)}$$

When Vct−Vofmx−Va=VSS=0, Vct=Vofmx+Va, and hence, $$VSS \leq Vdac \leq 2Va+2Vofmx=IO \cdot Rdac$$

wherein VSS indicates a ground voltage level.

Among the waveforms of the analog signal Vdac shown in FIG. 7(a), the waveform shown with a solid line is a waveform obtained by using the medium voltage level Vct as a reference, and the waveforms shown with dashed lines are waveforms obtained when the offset voltages Vof with the maximum value Vofmx and the minimum value −Vofmx have been applied. In FIGS. 7(a) through 7(c), it is assumed that Vofmx=Va and that the maximum value of the voltage level Vdac is one third of the voltage level VDD.

At this point, it is assumed that the signal ground voltage level Vsg is set at a half of the supply voltage level VDD as is shown in FIG. 7(b). Therefore, the following relational expression is obtained:

$$Vsg=VDD/2 \quad \text{Expression (53)}$$

Furthermore, it is assumed that the signal medium voltage level Vm is equal to the medium voltage level Vct of the analog signal Vdac, and the following relationship holds:

$$Vm=(VDD-VSS) \times R2/(R1+R2)=Vct \quad \text{Expression (54)}$$

When a voltage level equal to a voltage level difference between the signal ground voltage level Vsg and the signal medium voltage level Vm is applied to the analog signal Vdac so as to output the base band signal Vls, the following relational expression holds:

$$Vls=Vdac+Vsg-Vm \quad \text{Expression (55)}$$

On the basis of Expressions (51), (53), (54) and (55), the following relationship can be obtained:

$$Vls=Vdac+VDD/2-Vct$$

$$VDD/2+Vof-Va \leq Vls \leq VDD/2+Vof+Va \quad \text{Expression (56)}$$

The comparison between Expressions (51) and (56) reveals that the medium voltage level Vct is linearly level-shifted to the voltage level VDD/2.

Accordingly, the minimum value {Vls}min and the maximum value {Vls}max of the base band signal Vls are obtained as follows on the basis of Expressions (52) and (56):

$$\{Vls\}min=VDD/2+\{Vof\}min-Va=VDD/2-Vofmx-Va \quad \text{Expression (57)}$$
$$\{Vls\}max=VDD/2+\{Vof\}max+Va=VDD/2+Vofmx+Va \quad \text{Expression (58)}$$

Among the signal waveforms of the base band signal Vls shown in FIG. 7(c), the waveform shown with a solid line is a waveform obtained by using the voltage level VDD/2 as a reference and the waveforms shown with dashed lines are waveforms obtained when the offset voltages Vof with the maximum value Vofmx and the minimum value −Vofmx have been applied.

Expressions (15), (16) and (17) accord with Expressions (56), (57) and (58) of the comparative embodiment, respectively. This means that the D/A converter unit of the signal waveform generator shown in FIG. 2 has the offset voltage adjusting function similar to that of the D/A converter unit of the signal waveform generator shown in FIG. 6. Moreover, as is obvious from FIGS. 2 and 6, the number of the unit cell current cells of the D/A converter is substantially halved in FIG. 2. Accordingly, the power consumption as well as the circuit area of the signal waveform generator of this embodiment can be decreased as compared with those of the comparative embodiment.

As described above, the signal ground voltage level decision circuit has the function to adjust its output voltage level in accordance with the offset voltage adjusting signal in this embodiment. Therefore, the offset voltage to be applied to the base band signal can be adjusted by the signal ground voltage level decision circuit. As a result, the number of the unit current cells included in the current cell matrix type D/A converter can be reduced. Thus, the signal waveform generator with small power consumption and a small circuit area can be obtained.

(Embodiment 2)

Figure 8:
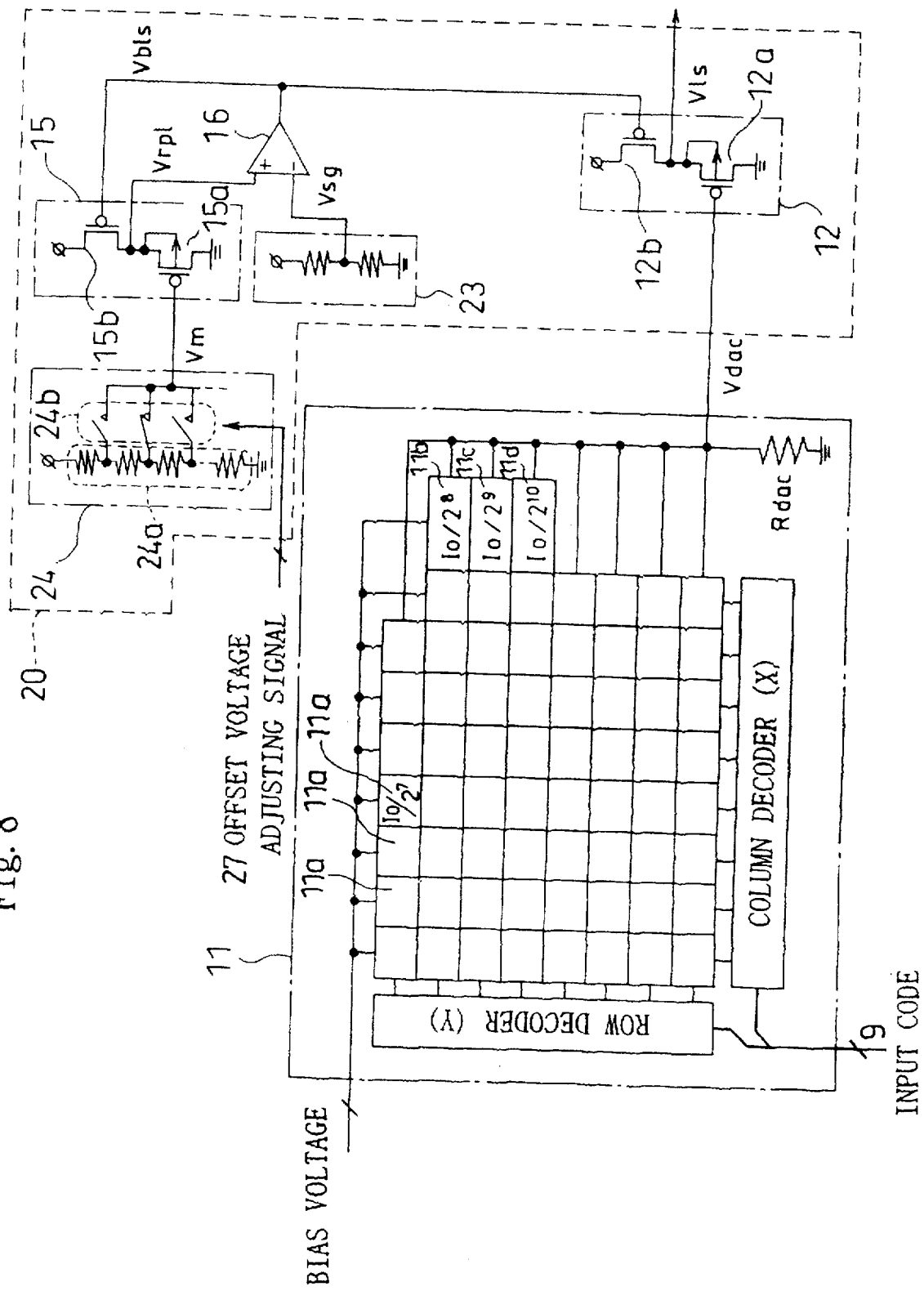
FIG. 8 is a circuit diagram for showing the configuration of a D/A converter unit of a signal waveform generator according to a second embodiment of the invention.

FIG. 8 is a circuit diagram for showing the configuration of a signal waveform generator according to the second embodiment of the invention. In FIG. 8, a reference numeral 11 denotes a current cell matrix type nine-bit D/A converter, a reference numeral 12 denotes a first signal level shifter, a reference numeral 15 denotes a second signal level shifter and a reference numeral 16 denotes an operational amplifier, all of which are respectively identical to those shown in FIG. 2 with the same reference numerals. Furthermore, a reference numeral 23 denotes a signal ground voltage level decision circuit serving as first reference voltage level generation means and a reference numeral 24 denotes a signal medium voltage level reference circuit serving as second reference voltage level generation means. The first signal level shifter 12, the signal ground voltage level decision circuit 23, the signal medium voltage level reference circuit 24, the second signal level shifter 15 and the operational amplifier 16 together form a level shift circuit 20.

The signal ground voltage level decision circuit 23 includes two resistances serially connected between a power supply and a ground, and outputs a voltage level at the node between the two resistances as a signal ground voltage level Vsg serving as a first reference voltage level.

The signal medium voltage level reference circuit 24 includes a plurality of resistances 24a serially connected between a power supply and a ground and a selector circuit 24b. The selector circuit 24b selects a voltage level at one node among the plural resistances 24a in accordance with a supplied offset voltage adjusting signal 27, so that a signal medium voltage level Vm is determined as a second reference voltage level.

As the characteristic of this embodiment, the signal medium voltage level reference circuit 24 has a function to adjust the offset voltage applied to a signal Vls.

The operation of the signal waveform generator of FIG. 8 will now be described in more detail referring to FIGS. 9(a) through 9(c).

FIG. 9(a) shows the signal waveform of an analog signal Vdac output by the current cell matrix type D/A converter 11. The voltage level of the analog signal Vdac is in the following range as in the first embodiment:

$$Vct-Va \leq Vdac \leq Vct+Va \qquad \text{Expression (21)}$$

$$\therefore VSS \leq Vdac \leq 2Va = IO/2 \times Rdac$$

FIG. 9(b) shows the ranges of the signal ground voltage level Vsg and the signal medium voltage level Vm.

The signal ground voltage level Vsg is assumed to be a half of the supply voltage level VDD and is represented as follows:

$$Vsg = VDD/2 \qquad \text{Expression (22)}$$

The signal medium voltage level Vm is adjusted by using a medium voltage level Vct of the analog signal Vdac in accordance with the offset voltage adjusting signal 27. When the offset voltage is indicated as Vof, the signal medium voltage level Vm is represented as follows:

$$Vm = Vct + Vof \qquad \text{Expression (23)}$$

When the maximum absolute value of the offset voltage Vof is indicated as Vofmx, since $|Vof| \leq Vofmx$, the following relationship holds:

$$Vct - Vofmx \leq Vm \leq Vct + Vofmx$$

In FIG. 9(b), it is assumed that Vofmx=Va.

FIG. 9(c) shows the waveform and the range of an output signal Vls of the first signal level shifter 12. Similarly to the first embodiment, in the first signal level shifter 12, the voltage equal to a voltage level difference between the signal ground voltage level Vsg and the signal medium voltage level Vm is analog-added to the analog signal Vdac, so as to output the signal Vls. Accordingly, similarly to Expression (14), the following relationship holds:

$$Vls = Vdac + Vsg - Vm \qquad \text{Expression (24)}$$

On the basis of Expressions (21), (22), (23) and (24), the following relational expression can be obtained:

$$Vls = Vdac + VDD/2 - (Vct + Vof) = Vdac + VDD/2 - Vct - Vof$$

$$VDD/2 - Vof - Va \leq Vls \leq VDD/2 - Vof + Va \qquad \text{Expression (25)}$$

The comparison between Expressions (11) and (25) reveals that the medium voltage level Vct of the analog signal Vdac is linearly level-shifted to a voltage level (VDD/2−Vof) in the signal Vls. In this manner the offset voltage applied to the signal Vls is adjusted by the offset voltage Vof applied to the signal medium voltage level Vm. However, the positive and negative of the offset voltage Vof is inverted for the analog addition.

Accordingly, the minimum value {Vls}min and the maximum value {Vls}max of the signal Vls are obtained as follows on the basis of Expressions (21) and (25):

$$\{Vls\}\text{min} = VDD/2 + \{-Vof\}\text{min} - Va = VDD/2 - Vofmx - Va \qquad \text{Expression (26)}$$

$$\{Vls\}\text{max} = VDD/2 + \{-Vof\}\text{max} - Va = VDD/2 + Vofmx + Va \qquad \text{Expression (27)}$$

Among the signal waveforms shown in FIG. 9(c), the waveform shown with a solid line is a waveform of the signal Vls obtained by using the voltage level VDD/2 as a reference and the waveforms shown with dashed lines are waveforms of the signal Vls obtained when the offset voltages Vof with the maximum value Vofmx and the minimum value −Vofmx have been applied.

Expressions (26) and (27) accord with Expressions (57) and (58) of the comparative embodiment, respectively. This means that the D/A converter unit of the signal waveform generator shown in FIG. 8 has the offset voltage adjusting function similar to that of the D/A converter unit of the signal waveform generator shown in FIG. 6. Moreover, as is obvious from FIGS. 6 and 8, the number of the unit cell current cells of the D/A converter is substantially halved in FIG. 8. Accordingly, the power consumption as well as the circuit area of the signal waveform generator of this embodiment can be decreased as compared with those of the comparative embodiment.

As described above, the signal medium voltage level reference circuit has the function to adjust the output voltage level in accordance with the offset voltage adjusting signal in this embodiment. Therefore, the offset voltage to be applied to the base band signal can be adjusted by the signal medium voltage level reference circuit. As a result, the number of the unit current cells included in the current cell matrix type D/A converter can be reduced. Thus, the signal waveform generator with small power consumption and a small circuit area can be obtained.

In the aforementioned embodiments, the amplitude Va of the base band signal is assumed to be equal to the maximum absolute value Vofmx of the offset voltage, which does not limit the invention. The same effects can be achieved even when the amplitude Va is different from the value Vofmx.

In addition, the application of the level shift circuits 10 and 20 of the first and second embodiments is not limited to the signal waveform generator, but these circuits can be used for another purpose as a level shift circuit for an analog signal having an offset voltage adjusting function.

What is claimed is:

1. A level shift circuit for level-shifting an input analog signal comprising:

a first signal level shifter for analog-adding a level shift voltage determined in accordance with a supplied bias voltage level signal to a voltage level of the analog signal input to the level shift circuit and outputting a voltage level obtained through analog addition as an output signal of the level shift circuit;

first reference voltage level generation means for generating an outputting a first reference voltage level;

second reference voltage level generation means for generating and outputting a second reference voltage level;

a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters, wherein the first reference voltage level generation means receives and offset voltage adjusting signal and has a function to change the first reference voltage level in accordance with the offset voltage adjusting signal, and the level shift voltage to be analog-added to the voltage level of the analog signal inputted to the first signal level shifter is obtained as a voltage level of a difference between the first reference voltage level changed in accordance with the offset voltage adjusting signal and the second reference voltage level.

2. The level shift circuit of claim 1, wherein the first reference generation means includes plural resistances serially connected between two power supply lines supplying different voltage levels, and selects one node among the plural resistances in accordance with the received offset voltage adjusting signal, so as to output a voltage level at the selected node as the first reference voltage level.

3. The level shift circuit of claim 1, wherein the second reference voltage level is equal to a voltage level that is midway between the maximum level and the minimum level of the analog signal inputted to the level shift circuit.

4. A level shift circuit for level-shifting an input analog signal comprising:

a first signal level shifter for analog-adding a level shift voltage determined in accordance with a supplied bias voltage level signal to a voltage level of the analog signal input to the level shift circuit and outputting a voltage level obtained through analog addition as an output signal of the level shift circuit;

first reference voltage level generation means for generating and outputting a first reference voltage level;

second reference voltage level generation means for generating and outputting a second reference voltage level;

a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters, wherein the second reference voltage level generation means receives an offset voltage adjusting signal and has a function to change the second reference voltage level in accordance with the offset voltage adjusting signal, and the level shift voltage to be analog-added to the voltage level of the analog signal inputted to the first signal level shifter is obtained as a voltage level of a difference between the first reference voltage level and the second reference voltage level changed in accordance with the offset voltage adjusting signal.

5. The level shift circuit of claim 4, wherein the second reference voltage level generation means includes plural resistances serially connected between two power supply lines supplying different voltage levels, and selects one node among the plural resistances in accordance with the received offset voltage adjusting signal, so as to output a voltage level at the selected node as the second reference voltage level.

6. The level shift circuit of claim 1 or 4, wherein each of the first and second signal level shifters includes:

a first MOSFET connected with a power supply at the source thereof;

a second MOSFET connected with the drain of the first MOSFET at the source thereof and grounded at the drain-thereof, wherein the gate of the second MOSFET serves as an input terminal, the drain of the first MOSFET serves as an output terminal, and the gate of the first MOSFET serves as an input terminal for the bias voltage level signal.

7. The level shift circuit of claim 4, wherein a maximum offset voltage of the second reference voltage level is equal to an amplitude of the analog signal inputted to the level shift circuit.

8. A signal waveform generator comprising:

memory means for storing codes corresponding to amplitude values of a signal and outputting a code in a specified address;

a D/A converter unit for receiving the code output by the memory means, converting the code into an analog signal and outputting the analog signal; and a low-pass filter for receiving the analog signal output by the D/A converter unit, removing a high frequency component from the analog signal and outputting a resultant signal, wherein the signal output by the low-pass filter is an output signal of the signal waveform generator, and the D/A converter unit includes:

a D/A converter for generating an analog signal by D/A converting the code output by the memory means and outputting the analog signal; and a level shift circuit for not only level-shifting the analog signal output by the D/A converter and but also adjusting an offset voltage.

9. The signal waveform generator of claim 8, wherein the level shift circuit includes:

a first signal level shifter for analog-adding a level shift voltage determined in accordance with a supplied bias voltage level signal to a voltage level of the analog signal output by the D/A converter and outputting a voltage level obtained through analog addition as an output signal of the level shift circuit;

first reference voltage level generation means for generating and outputting a first reference voltage level;

second reference voltage level generation means for generating and outputting a second reference voltage level;

a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters, wherein the first reference voltage level generation means receives an offset voltage adjusting signal and has a function to change the first reference voltage level in accordance with the offset voltage adjusting signal, and the level shift voltage to be analog-added to the voltage level of the analog signal outputted by the D/A converter is obtained as a voltage level of a difference between the first reference voltage level changed in accordance with the offset voltage adjusting signal and the second reference voltage level.

10. The signal waveform generator of claim 8, wherein the level shift circuit includes:

a first signal level shifter for analog-adding a level shift voltage determined in accordance with a supplied bias voltage level signal to a voltage level of the analog signal output by the D/A converter and outputting a voltage level obtained through analog addition as an output signal of the level shift circuit;

first reference voltage level generation means for generating and outputting a first reference voltage level;

second reference voltage level generation means for generating and outputting a second reference voltage level;

a second signal level shifter having the same level shift characteristic as the first signal level shifter for analog-adding the level shift voltage determined in accordance with the supplied bias voltage level signal to the second reference voltage level and outputting a voltage level obtained through analog addition; and an operational amplifier, which receives the voltage level output by the second signal level shifter at a non-inverted input terminal thereof and the first reference voltage level at an inverted input terminal thereof, for generating the bias voltage level signal so as to make the voltage level output by the second signal level shifter equal to the first reference voltage level and outputting the bias voltage level signal to the first and second signal level shifters, wherein the second reference voltage level generation means receives an offset voltage adjusting signal and has a function to change the second reference voltage level in accordance with the offset voltage adjusting signal, and the level shift voltage to be analog-added to the voltage level of the analog signal outputted by the D/A converter is obtained as a voltage level of a difference between the first reference voltage level and the second reference voltage level changed in accordance with the offset voltage adjusting signal.

11. The signal waveform generator of claim 8, wherein the D/A converter includes m constant current sources and a resistance element, where m is a positive integer, and arbitrary n constant current sources are selected among the m constant current sources in accordance with an input digital signal, where $0 \leq n \leq m$, and output currents of the selected constant current sources are supplied to the resistance element, so as to generate the analog signal through voltage decrease in the resistance element and output the analog signal.

* * * * *